(12) United States Patent
Gayet

(10) Patent No.: US 6,392,299 B1
(45) Date of Patent: May 21, 2002

(54) INTEGRATED CIRCUIT AND ASSOCIATED FABRICATION PROCESS

(75) Inventor: Philippe Gayet, St. Vincent de Mercuze (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/449,309

(22) Filed: Nov. 24, 1999

(30) Foreign Application Priority Data

Nov. 26, 1998 (FR) .............................................. 98 14908

(51) Int. Cl.$^7$ ................................................. H01L 23/48
(52) U.S. Cl. .......................... 257/758; 257/773; 257/774
(58) Field of Search .............................. 257/758, 759, 257/760, 773, 774, 775, 776

(56) References Cited

U.S. PATENT DOCUMENTS

| | | | |
|---|---|---|---|
| 5,471,093 A | 11/1995 | Cheung | 257/758 |
| 5,517,060 A | * 5/1996 | Kobayashi | 257/758 |
| 5,739,579 A | * 4/1998 | Chiang et al. | 257/635 |
| 5,847,462 A | * 12/1998 | Bandyopadhyay et al. | 257/751 |
| 5,854,131 A | * 12/1998 | Dawson et al. | 438/666 |
| 6,031,289 A | * 2/2000 | Fulford, Jr. et al. | 257/758 |
| 6,137,178 A | * 10/2000 | Park | 257/758 |
| 6,259,162 B1 | * 7/2001 | Ma et al. | 257/774 |

FOREIGN PATENT DOCUMENTS

| | | | |
|---|---|---|---|
| EP | 0 703 611 A1 | 3/1996 | H01L/21/768 |
| JP | 04113625 | 4/1992 | H01L/21/3205 |
| WO | 97/47038 | 12/1997 | H01L/23/522 |
| WO | 97/47039 | 12/1997 | H01L/23/522 |
| WO | 98/03994 | 1/1998 | H01L/21/768 |

OTHER PUBLICATIONS

"Damascene: Optimized Etch Stop Structure and Method", IBM Technical Disclosure Bulletin, vol. 36, No. 11, Nov. 1, 1993, p. 649, XP000424980 ISSN: 0018–8689.

"Displaced Metal Conductor", IBM Technical Disclosure Bulletin, vol. 36, No. 11, Nov. 11, 1993, pp. 599–602.

* cited by examiner

Primary Examiner—Tuan Quach
(74) Attorney, Agent, or Firm—Lisa K. Jorgenson; Allen, Dyer, Doppelt, Milbrath & Gilchrist, P.A.

(57) ABSTRACT

An interconnect level includes upper and lower partial levels having respective conductive lines offset heightwise from each other. The interconnect level further includes respective dielectric portions separating adjacent conductive lines and extends above and below the conductive lines. At least one descending via connects a conductive line of the upper partial level with a lower element located below the dielectric portions of the interconnect level. The at least one descending via extends through the dielectric portions separating adjacent conductive lines of the lower partial level. At least one ascending via connects a conductive line of the lower partial level with an upper element located above the dielectric portions of the interconnect level. At least one ascending via extends through the dielectric portions separating adjacent conductive lines of the upper partial level.

18 Claims, 6 Drawing Sheets

INTEGRATED CIRCUIT AND ASSOCIATED FABRICATION PROCESS

FIELD OF THE INVENTION

The present invention relates to the field of integrated circuits, and, more particularly, to an integrated circuit comprising a stack of conducting layers separated by insulating layers, and to a fabrication process thereof.

BACKGROUND OF THE INVENTION

In an integrated circuit that includes conducting layers separated by one or more insulating layers, it is necessary to establish electrical connections between various levels of the conducting layers. Typically, two conducting layers are electrically connected by holes provided in the insulating layer and filled with metal, with such a connection being called a via.

The integrated circuits may be produced in a conventional manner by depositing and then etching a metal layer, and by filling the spaces exposed by the etching with a dielectric material. The integrated circuits may also be produced using a process called damascene, in which a first insulating layer is deposited on a metal layer of level n−1. The holes through this insulating layer are etched, the metal forming the via is deposited and polished to be level with the upper surface of the insulating layer. Then a new insulating layer is deposited on the via of level n thus formed. The trenches forming the future lines are etched, and the. metal forming the lines of the metal layer of level n is deposited. The metal is polished to be level with the upper surface of the insulating layer, etc. This process is well suited to the production of lines and vias made of copper since this material can not be etched at room temperature and has advantageous electrical characteristics for lines having a small cross section. This process can also be used with metals normally forming the lines and vias.

In a double damascene process, the metal is deposited both in the vias and the lines, and then polished. In one method of implementation, a stop layer, usually made of a nitride, is provided between an insulating layer of the vias and the lines. To obtain the final structure, there needs to be excellent selectivity of the etching of the oxide forming the insulating layer as compared with the nitride.

To increase the density of an integrated circuit, attempts have been made to reduce the width of the metal lines and the width of the dielectric materials separating two metal lines. However, the electrical capacitance existing between two adjacent metal lines is inversely proportional to the distance separating them. By reducing this distance to increase the density of the circuit, the interline capacitance is increased. This is a problem since it results in an increase in the propagation constant τ of the electrical signal in the lines:

$$\tau = R*C$$

The variable R is the resistance of the metal line, and C is the interline capacitance. The stray coupling between two electrical signals propagating in two adjacent lines, i.e., crosstalk, is also increased. his interline capacitance is proportional to the permitivity coefficient k of the dielectric material used, and is proportional to the lateral area of the lines. The tendency is to use dielectric materials having a low permitivity coefficient k, or to use less resistive conducting materials, such as copper, to reduce the height of the lines and the lateral area.

However, the use of dielectric materials having a low permitivity coefficient and the use of less resistive conducting materials still cause integration problems in the field of integrated-circuit fabrication.

SUMMARY OF THE INVENTION

An object of the present invention is to remedy the drawbacks of the abovementioned techniques by providing an integrated circuit having reduced interline capacitances.

The integrated circuit comprises tracks of at least one metal level provided with dielectric layers and with metal vias connecting tracks of two adjacent levels. At least one part of at least one metal level n is split into two partial levels offset heightwise. The circuit comprises at least one via connecting a track of the upper partial level with an element lying below the dielectric layer of level n. This via passes through the dielectric layer of level n and the dielectric material separating the tracks of the lower partial level. The circuit comprises at least one via connecting a track of the lower partial level with a track of a metal level n+1. This via passes through the dielectric layer of level n+1 and the dielectric material separating the tracks of the upper partial level. The average distance mutually separating the conducting tracks are increased and the interline capacitances which are inversely proportional to this distance are decreased.

In one embodiment, part of the tracks of the metal level are divided between an upper partial level and a lower partial level.

In another embodiment, part of the tracks of the metal level are provided without them intersecting.

In yet another embodiment, the upper and lower partial levels are adjacent.

In a further embodiment, the upper and lower partial levels are separated by an additional layer of dielectric material.

In another embodiment of the invention, at least one via connecting a track of the upper partial level with an element lying below the dielectric layer of level n pass through an additional layer of dielectric material. At least one via connecting a track of the lower partial level with a track of a metal level n+1 pass through the additional layer of dielectric material. The upper and lower partial levels may be separated by an additional layer of dielectric material and by a stop layer.

In the process for fabricating an integrated circuit according to the invention, a second dielectric layer is deposited on a first dielectric layer provided with vias. Trenches are etched in the second dielectric layer and conducting tracks are produced by filling the trenches with a metal. A third dielectric layer is deposited. Trenches are etched in the third dielectric layer and conducting tracks are produced by filling the trenches with metal. At least one part of the metal level thus obtained is split into two partial levels offset heightwise.

In one embodiment, a stop layer may be deposited before the third dielectric layer to control the depth of the trenches.

In the process for fabricating an integrated circuit according to the invention, a stop layer is deposited on a first dielectric layer and holes are etched in the stop layer. A second dielectric layer is deposited. Trenches are etched in the second dielectric layer, and holes are etched in the first dielectric layer at positions corresponding to the holes in the stop layer. Vias and conducting tracks are produced by filling the holes and the trenches with metal. A third dielectric layer and a second stop layer are deposited, and holes are etched in the second stop layer. A fourth dielectric layer is deposited. Trenches are etched in the fourth dielectric layer, and holes are etched in the third dielectric layer at the positions corresponding to the holes in the second stop layer. Vias and conducting tracks are produced by filling the holes and the trenches with metal to obtain at least one part of the metal level that is split into two partial levels offset heightwise.

In the process for fabricating a first metal layer is deposited on a dielectric layer provided with vias, and then etched. The open spaces left by the etching are filled with dielectric material. A second metal layer is deposited and then etched. The open spaces left by the etching are filled with dielectric material to obtain at least one part of the metal level that is split into two partial levels offset heightwise.

The masks used for the fabrication of the conducting lines may include recessed zones corresponding to extensions used for respectively connecting a line of a given upper or lower partial level with a via located opposite the partial level, under the lower partial level or on the upper partial level. Thus, an integrated circuit is provided which can be produced with very small widths of dielectric material between lines because of the use of the improved geometry according to the invention, and which can be fabricated using different technologies.

BRIEF DESCRIPTION OF THE DRAWINGS

The present invention will be more clearly understood on studying the detailed description of a few embodiments given by way of entirely non-limiting examples and illustrated by the appended drawings in which.

DETAILED DESCRIPTION OF THE PREFERRED EMBODIMENTS

Figure 1:
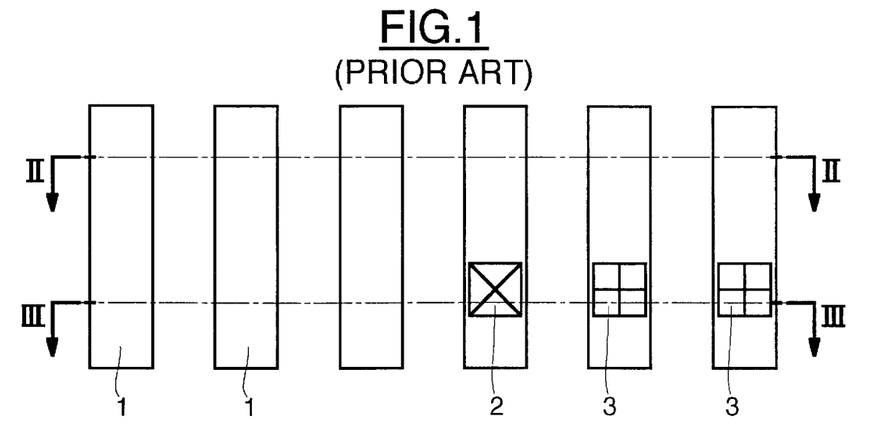
FIG. 1 is a top view of an integrated circuit according to the prior art.
Figure 2:
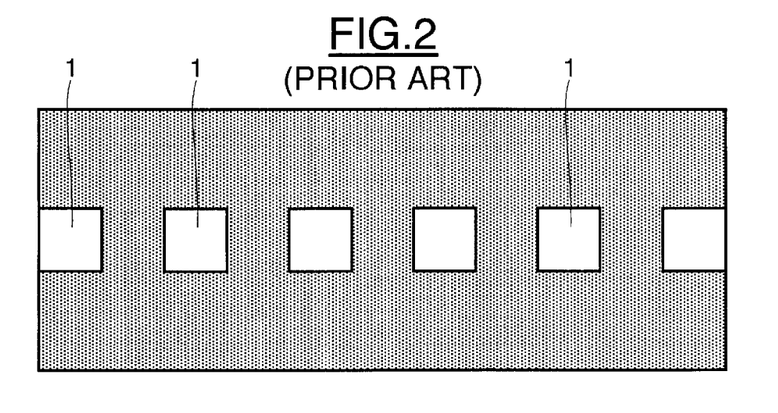
FIGS. 2 and 3 are respective cross-sectional views on sections II—II and III—III in FIG. 1.
Figure 3:
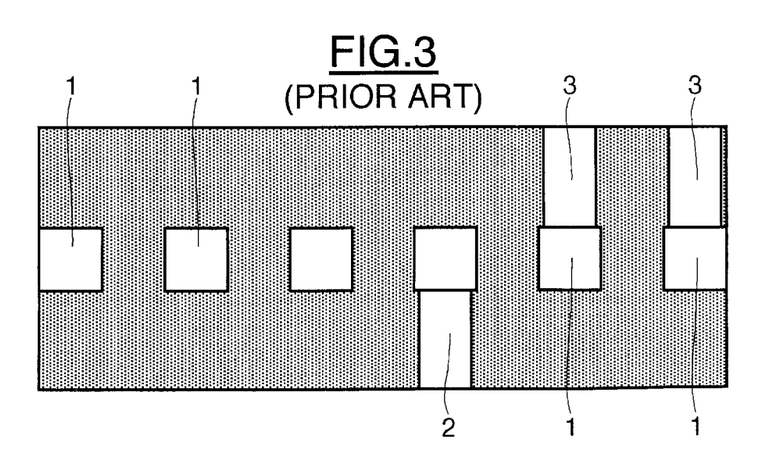

Referring now to FIGS. 1 to 3, a portion of an integrated circuit comprises, at a given conducting level, a plurality of conducting lines 1 and a plurality of vias 2, 3. The vias 2, 3 allow two lines of adjacent and superposed conducting layers, or a line of a conducting layer and a portion of a semiconductor substrate located underneath, to be electrically connected together. More particularly, FIG. 3 shows that the via 2 allows a line 1 of a given conducting layer to be connected with an element located there beneath. The vias 3 allow lines 1 to be connected to elements located above the conducting layer to which the lines 1 belong. The capacitance existing between two lines 1 of the same conducting level is proportional to the permitivity of the dielectric separating them and to their area facing each other, and inversely proportional to the distance separating them.

Figure 4:
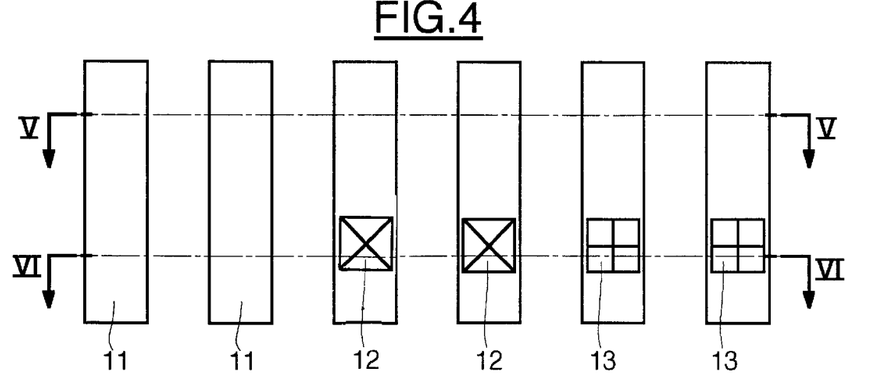
FIG. 4 is a top view of an integrated circuit according to the present invention.

When referring to the following figures, the reference numbers of similar elements to those in previous figures have been increased by 10. FIG. 4 shows that the integrated circuit according to the invention comprises metal lines 11, descending vias 12 and ascending vias 13. However, the invention may also apply to integrated circuits provided with a single conducting layer in which the vias are only descending, i.e., going down to the semiconductor substrate.

Figure 5:
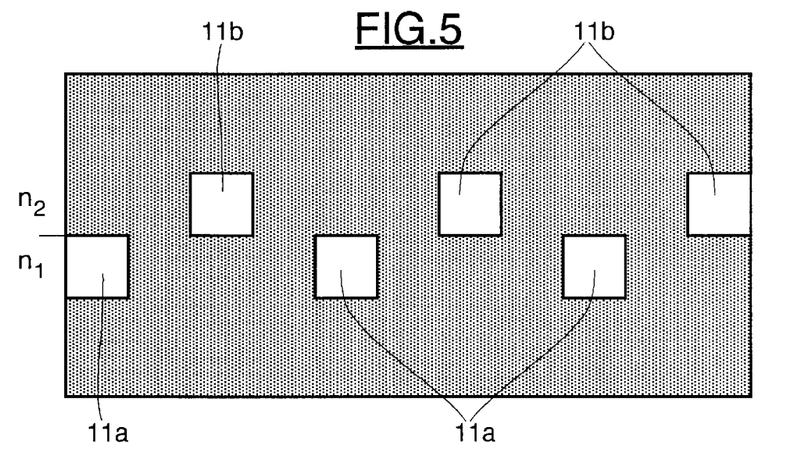
FIGS. 5 and 6 are respective cross-sectional views on sections V—V and VI—VI in FIG. 4.

FIG. 5 shows that some of the conducting lines of the conducting level illustrated have been offset heightwise. Thus, the lines 11a lie at a lower partial level while the lines 11b lie at an upper partial level. This combination provides the same connections as a conventional conducting level. Preferably, one conducting line in two is offset in this way, thereby making it possible to increase the average distance between two lines for the largest number of possible lines. This reduces their interline capacitances by increasing the distance separating them without having to modify the layout or design of the integrated circuit.

Figure 6:
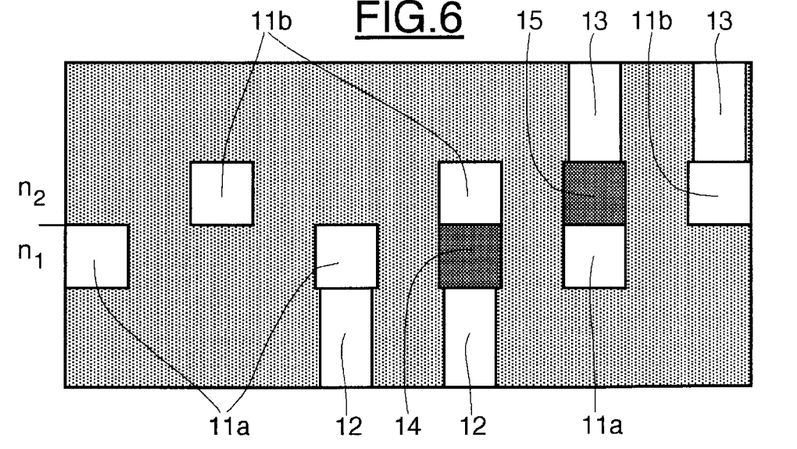

FIG. 6 shows the way in which the vias are connected upwards or downwards with respect to the conducting level split into two partial levels. The via 12 is intended to provide electrical connection between an element (not illustrated) lying at a lower level and a line 11b lying at the upper partial level $n_2$. An extension, labeled 14, of the via 12 is therefore provided at the lower partial level $n_1$. The extension 14 lies at the lower partial level $n_1$ and may have the same width as the lines 11a, 11b.

Similarly, it may be seen that one of the vias 13 is intended to connect a line 11a of the lower partial level $n_1$ to an element (not illustrated) of an upper level. The via 13 is provided with a downward extension 15 lying at the upper partial level $n_2$, and provides electrical connection between the actual via 13 and the conducting line 11a with which the via has to be connected. Conversely, a via 13 may be connected directly with a line 11b while a via 12 may be connected directly with a line 11a.

The presence of the extensions 14 and 15 of the vias 12 and 13 in the lower $n_1$ and upper $n_2$ partial levels has only a slight effect on the interline capacitances. This is so because the extensions 14 and 15 are at discrete locations, have the same width as a line, and have a length equivalent to the width of a via or to the width of a line. Therefore, their presence results only in a very small increase in the interline capacitances because of this small area presented opposite the other lines. This increase remains negligible compared with the reduction in the interline capacitances obtained by virtue of the invention.

Figure 7:
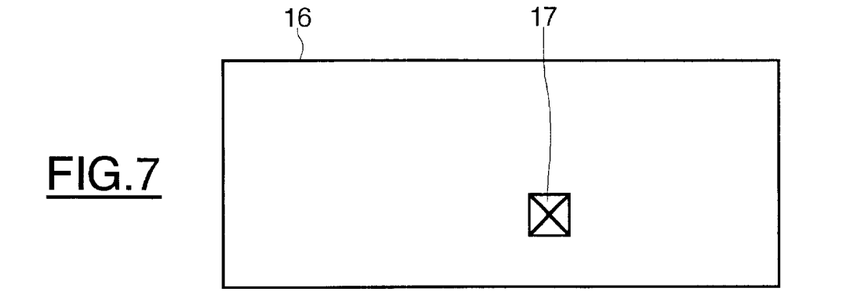
FIGS. 7 to 10 are top views of the masks used for the fabrication of an integrated circuit according to the present invention.

FIGS. 7 to 10 illustrate the various resin masks used for fabricating an integrated circuit like the one illustrated in FIGS. 4 to 6. In FIG. 7, the mask 16 comprises a recessed zone 17 obtained, for example, by photoetching at the position corresponding to the future via 12. This mask 16 may be used in the case of a double-damascene process with a stop layer for etching the stop layer on which the lower partial level $n_1$ will lie. In the case of a single-damascene process, the mask 16 will serve for etching the dielectric layer lying below the lower partial level $n_1$ of the hole corresponding to the future via 12.

Figure 8:
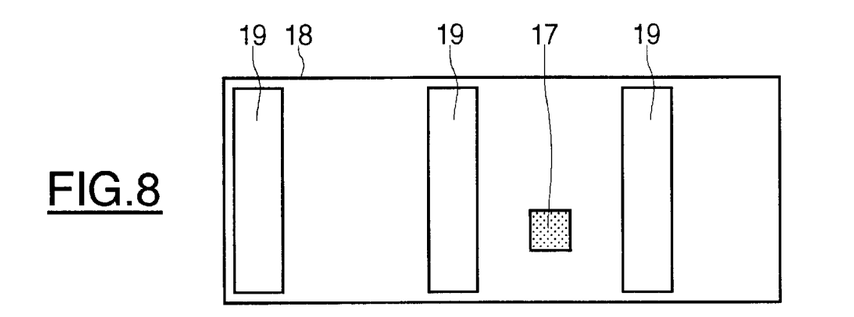

The mask 18 illustrated in FIG. 8 comprises recessed zones 19 which correspond to the positions of the future lines 11a of the lower partial level $n_1$, and a recessed zone 17 placed in the identical manner to that provided in the mask 16. This is intended for the manufacture of the extension 14 of the via 12 still at the level $n_1$. The mask 18 is used for etching a dielectric layer which lies at the level $n_1$, and which will provide the insulation between the various lines 11a and the extension 14.

Figure 9:
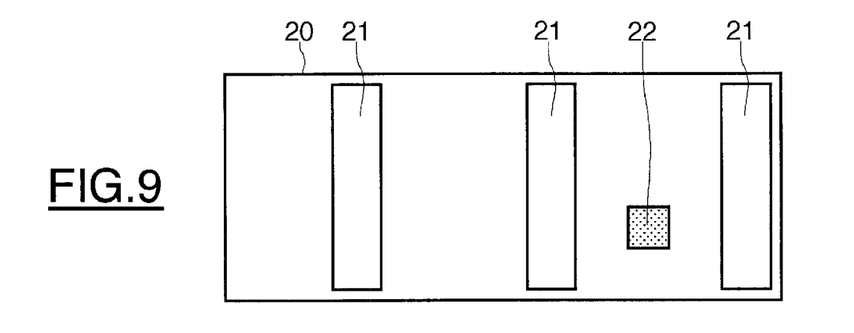

The mask 20 illustrated in FIG. 9 comprises recessed zones 21 at positions corresponding to the future lines 11b of the upper partial level $n_2$, and a recessed zone 22 corresponding to the position of the future extension 15 of the via 13 at the level $n_2$. In the same way as the mask 18, the mask 20 is used for etching a dielectric layer of the level $n_2$, which will provide the electrical insulation between the various lines 11b and the extension 15.

Figure 10:
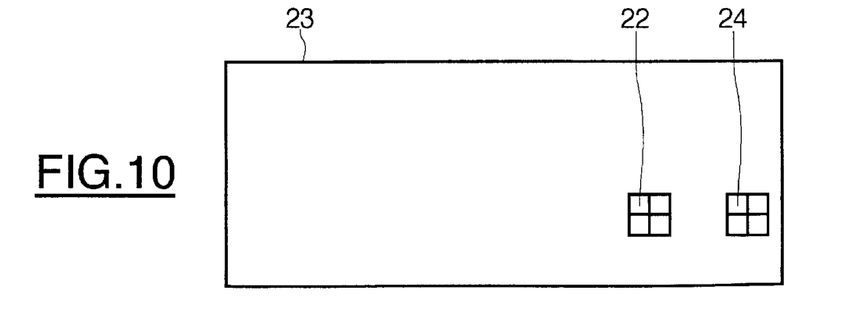

The mask 23 illustrated in FIG. 10 comprises a recessed zone 22 identical to that of the mask 20, The recessed zone 22 corresponds to the position of a future via 13 and a recessed zone 24 corresponds to the position of another future via 13. In a single-damascene process, the mask 23 is used for etching the dielectric layer which separates the upper partial level $n_2$ from another conducting level lying above it. In a double-damascene process with a stop layer, the mask 10 is used for etching a stop layer (not illustrated) lying above the dielectric layer separating the upper partial level $n_2$ from the conducting level lying above it.

Figure 11:
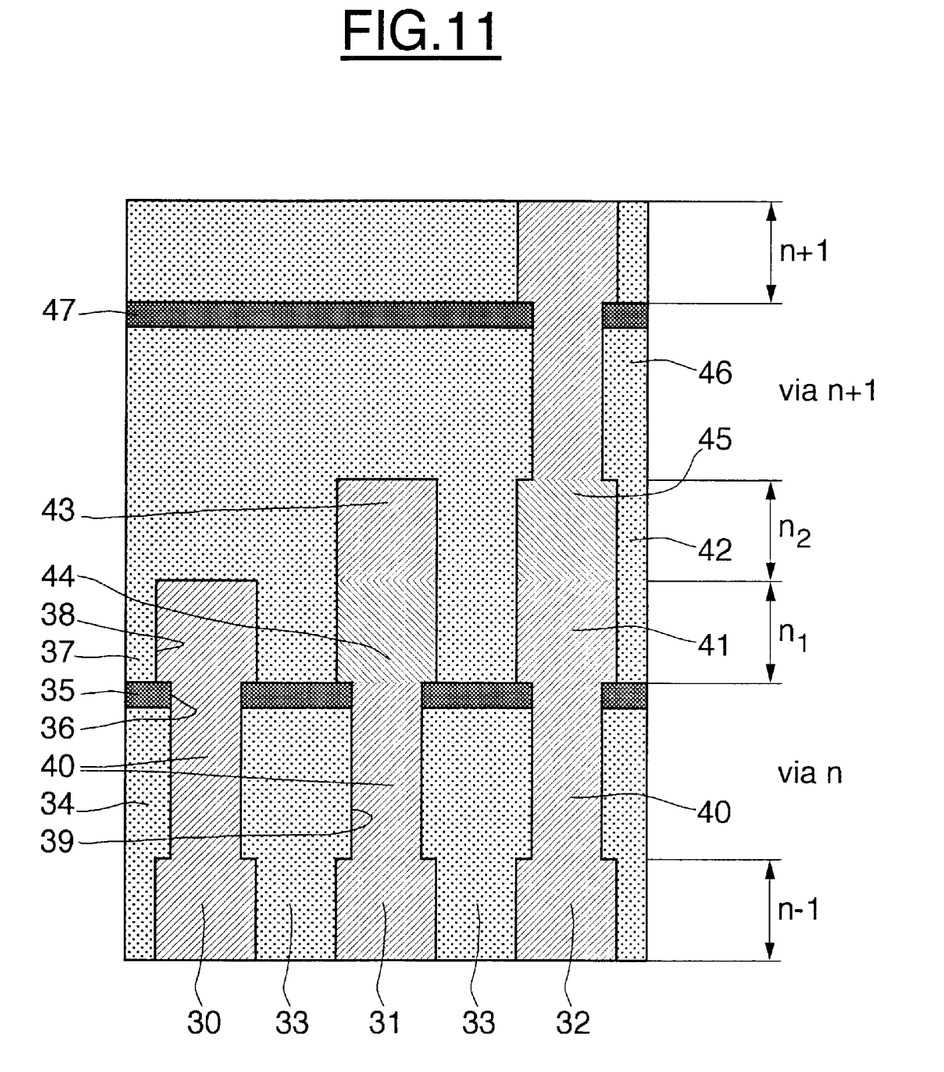
FIGS. 11 to 13 are cross-sectional views of an integrated circuit according to the present invention.

FIG. 11 illustrates an integrated circuit fabricated according to a double-damascene process with a stop layer. Deposited on a conducting level n−1 are a dielectric layer 34 made of silicon oxide, for example, and a thin stop layer 35 made of silicon nitride, for example. The conducting level n−1 comprises conducting lines 30, 31 and 32 separated by a dielectric material 33. Next, the stop layer 35 is etched using a resin mask to obtain three holes 36 in the stop layer 35. The resin mask may be of the type like the mask 16 in FIG. 7. This etching step is stopped when the dielectric layer 34 is reached.

The dielectric layer 37 made of silicon oxide, for example, is then deposited. The dielectric layer 37 is etched using a resin mask to define trenches 38 in the dielectric layer 37 and holes 39 in the dielectric layer 34 by making use of the holes 36 already formed in the stop layer 35. The resin mask may be of the type like the mask 18 in FIG. 8. Next, the holes 39 and the trenches 38 are filled with metal, and thus the vias 40 and the lines 41 of the lower partial level $n_1$ are formed.

To form the upper partial level n2, a dielectric layer 42 is deposited and etched using a mask, and the trenches thus formed are filled with metal to obtain lines 43. The mask may be of the type like the mask 20 in FIG. 9. At the level $n_1$, the via 40 lying above the line 31 has been provided with an extension 44 which allows it to be connected to the line 43. The extension 44 lies at the lower partial level $n_1$, and is formed at the same time as the lines 41 of the level $n_1$. Likewise, at the level $n_2$, an extension 45 is provided which allows the line 41 lying above the line 32 to be connected with a via of level n+1. Next, a dielectric layer 46 followed by a stop layer 47 is deposited and the steps described above may be repeated to form a conducting level n+1. This level may be of a conventional type on a single level, or of the type according to the invention, i.e., on two partial levels.

Figure 12:
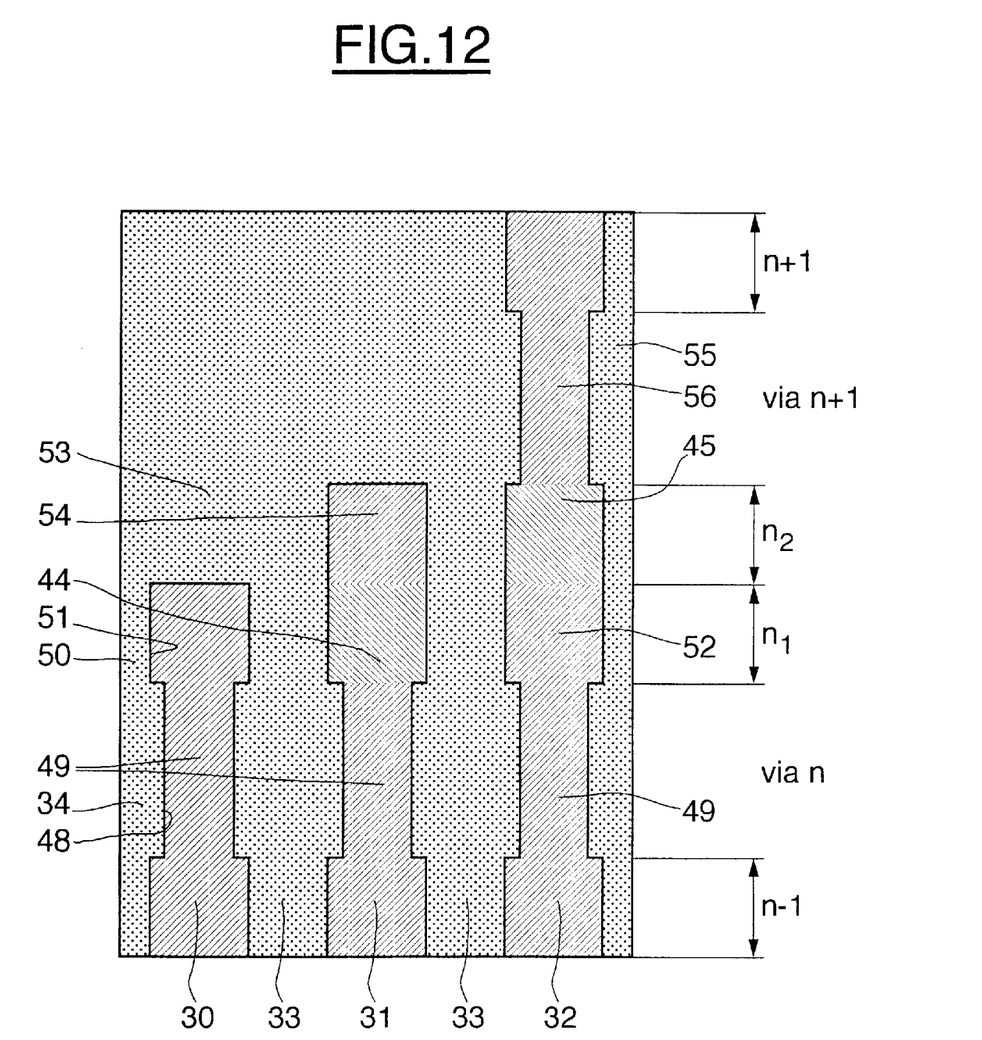

FIG. 12 illustrates an integrated circuit obtained by a single-damascene process according to the invention. Deposited on a conducting level n−1 is a dielectric layer 34 which is etched for the purpose of forming holes 48. These holes 48 are then filled with metal to form vias 49 of level n. The conducting level n−1 comprises conducting lines 30 to 32 separated by a dielectric material 33. This etching step may be carried out using a resin mask. The resin mask may be of the type like the mask 16 in FIG. 7.

A dielectric layer 50 is then deposited to form the lower partial level $n_1$. This is then etched by using a resin mask, thereby making it possible to obtain trenches 151 which are then filled with metal to form lines 52. The resin mask may be of the type like the mask 18 in FIG. 8. Next, a dielectric layer 53 is deposited and etched using a resin mask. The resin mask may be of the type like the mask 20 in FIG. 9.

Next, the trenches thus obtained are filled with metal to form the conducting lines 54 of the conducting level $n_2$.

As in the case of the integrated circuit illustrated in the previous figure, extensions 44 and 45 are provided. Next, a dielectric layer 55 is deposited and etched using a resin mask to form vias 56 of level n+1. The resin mask may be of the type like the mask 23 in FIG. 10. The previous steps may then be repeated to form the conducting level n+1, which may be of the conventional type or of the type split into two partial levels offset heightwise in accordance with the invention.

Figure 13:
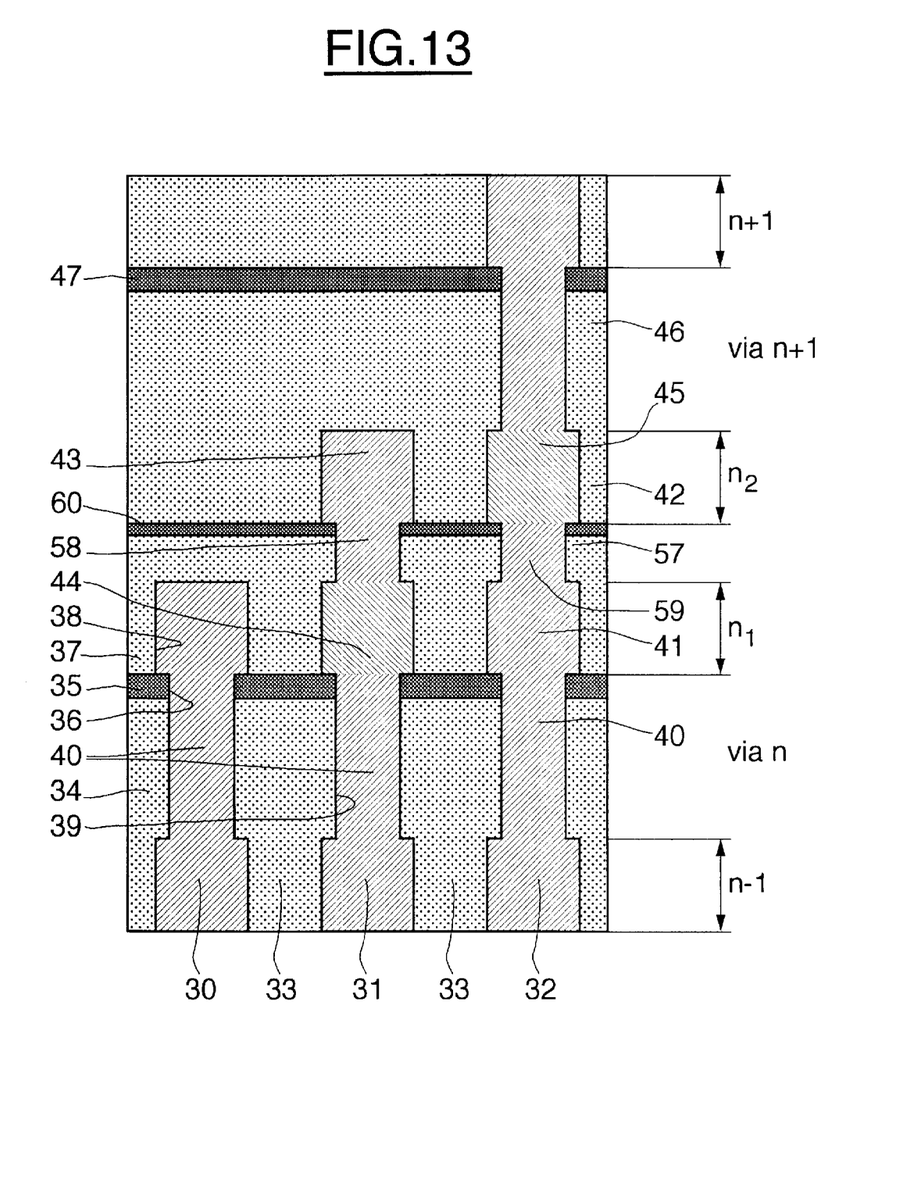

FIG. 13 illustrates an alternative embodiment of the integrated circuit in FIG. 11. According to this alternative embodiment, the two lower $n_1$ and $n_2$ partial levels are separated by an additional layer 57 made of dielectric material and by an additional stop layer 60. The additional layer 57 is provided with additional vias 58 and 59 which makes it possible to provide electrical contact between the lower partial level $n_1$ and the upper partial level $n_2$. The additional via 58 lies between the conducting line 43 of the level $n_2$ and the extension 44 at the level $n_{+1}$ of the via 40 at level n. The additional via 59 lies between the conducting line 41 of the level $n_1$ and the extension 45 of level $n_2$ of the corresponding via of level $n_{+1}$.

These additional vias are used for making the necessary electrical connections while making it possible to increase the distance between the various conducting lines, such as line 41 and 43, for example. By virtue of this arrangement, an even greater decrease in the interline capacitances is obtained. In FIGS. 11 to 13, the level n−1 was regarded as a conducting level. However, it could be the semiconductor substrate while still remaining within the scope of the invention.

By virtue of the invention, the speed performance of the integrated circuit is enhanced because of the reduction in the time constant R×C, where R is the resistance of a line and C is the interline capacitance. The interline crosstalk is also reduced because of the reduction in the interline capacitances. Interline capacitance reduction is achieved independently of the dielectric material used and independently of the height of the lines, and without increasing the number of interconnection levels in the design of the circuit. In addition, the fact that a given conducting level is split into two partial levels does not require the entire integrated circuit to be redesigned, something which would be extremely expensive. Instead, only a modification to the pre-existing drawings is required to define the masks that are needed.

The integrated circuit according to the invention can therefore be obtained using damascene fabrication processes regardless of the type of damascene process used. The integrated circuit according to the invention can also be obtained using conventional fabrication processes, i.e., by photolithographic etching of a metal layer. Of course, an integrated circuit may be produced with only one conducting level according to the invention, or with several conducting layers according to the invention. It is thus possible to modify the fabrication of an integrated circuit already in production by producing a conducting level where a particular interline capacitance problem exists. In the case of a circuit fabricated in double-damascene technology with an additional dielectric layer, the additional dielectric layer and the level $n_2$ may be produced using a double-damascene process. This saves time and reduces the cost of fabrication. It is also possible to use low-permitivity dielectrics and low-resistivity metals for the lines and the vias.

That is claimed is:

1. An integrated circuit comprising:

an interconnect level comprising upper and lower partial levels including respective conductive lines offset heightwise from each other, and respective dielectric portions separating adjacent conductive lines and extending above and below the conductive lines;

at least one descending via connecting a conductive line of the upper partial level with a lower element located below the dielectric portions of said interconnect level, the at least one descending via including an extension extending through the dielectric portions separating adjacent conductive lines of the lower partial level; and at least one ascending via connecting a conductive line of the lower partial level with an upper element located above the dielectric portions of said interconnect level, at least one ascending via including an extension extending through the dielectric portions separating adjacent conductive lines of the upper partial level.

2. An integrated circuit according to claim 1, wherein said at least one descending via comprises a second descending via connecting a second conductive line of the lower partial level with a second lower element located below the dielectric portions of said interconnect level, the second descending via extends through the dielectric portions under the second conductive line.

3. An integrated circuit according to claim 1, further comprising a semiconductor substrate including the lower element.

4. An integrated circuit according to claim 1, further comprising an,upper interconnect level including the upper element.

5. An integrated circuit according to claim 1, wherein said conductive lines are divided between said upper and lower partial levels.

6. An integrated circuit according to claim 1, wherein said conductive lines do not intersect each other.

7. An integrated circuit according to claim 1, further comprising a third dielectric layer separating the upper and lower partial levels.

8. An integrated circuit according to claim 7, wherein said at least one descending and ascending vias pass through said third dielectric layer.

9. An integrated circuit according to claim 1, further comprising a third dielectric layer and a stop layer adjacent said third dielectric layer separating said upper and lower partial levels.

10. An integrated circuit comprising:

a semiconductor substrate comprising at least one lower element;

an interconnect level on said semiconductor substrate comprising upper and lower partial levels including respective conductive lines offset heightwise from each other, and respective dielectric portions separating adjacent conductive lines and extending above and below the conductive lines; and at least one descending via connecting a conductive line of the upper partial level with said at least one lower element, the at least one descending via including an extension extending through the dielectric portions separating conductive lines of the lower partial level.

11. An integrated circuit according to claim 10, further comprising at least one ascending via connecting a conductive line of the lower partial level with an upper element located above the dielectric portions of said interconnect level, said at least one ascending via extending through the dielectric portions separating conductive lines of the upper partial level.

12. An integrated circuit according to claim 11, further comprising an upper interconnect level including the upper element.

13. An integrated circuit according to claim 10, wherein said at least one lower element comprises a second lower element; the integrated circuit further comprising at least one descending via connecting a conductive line of the lower partial level with said second lower element, said at least one descending via extending through the dielectric portions of the lower partial level below the conductive line.

14. An integrated circuit according to claim 10, wherein said conductive lines are divided between said upper and lower partial levels.

15. An integrated circuit according to claim 10, wherein said conductive lines do not intersect each other.

16. An integrated circuit according to claim 10, further comprising a third dielectric layer separating the upper and lower partial levels.

17. An integrated circuit according to claim 16, wherein said at least one descending and ascending vias pass through said third dielectric layer.

18. An integrated circuit according to claim 10, further comprising a third dielectric layer and a stop layer adjacent said third dielectric layer separating said upper and lower partial levels.

* * * * *